(12) United States Patent
Arai et al.

(10) Patent No.: US 6,262,433 B1
(45) Date of Patent: Jul. 17, 2001

(54) ORGANIC ELECTROLUMINESCENT DEVICE

(75) Inventors: Michio Arai; Isamu Kobori; Etsuo Mitsuhashi, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/339,880

(22) Filed: Jun. 25, 1999

(30) Foreign Application Priority Data

Mar. 16, 1999 (JP) .................................................. 11-069966

(51) Int. Cl.$^7$ .................................................. H01L 35/24
(52) U.S. Cl. .................. 257/40; 257/40; 257/79; 257/94; 313/503; 313/504; 313/506; 428/690
(58) Field of Search ................... 257/40, 79, 94; 313/503, 504, 506; 428/690

(56) References Cited

U.S. PATENT DOCUMENTS

| | | | |
|---|---|---|---|
| 5,059,861 | * 10/1991 | Littman et al. | 313/503 |
| 5,457,565 | 10/1995 | Namiki et al. . | |
| 5,952,779 | 4/1999 | Arai et al. . | |
| 5,969,474 | 10/1999 | Arai . | |
| 6,069,442 | * 5/2000 | Hung et al. | 313/504 |

FOREIGN PATENT DOCUMENTS

| | | |
|---|---|---|
| 2-139893 | 5/1990 | (JP) . |
| 4-276668 | 10/1992 | (JP) . |
| 5-3080 | 1/1993 | (JP) . |
| 6-163158 | 6/1994 | (JP) . |
| 9-17574 | 1/1997 | (JP) . |
| 10-125474 | 5/1998 | (JP) . |
| 10-270171 | 10/1998 | (JP) . |
| 10-270172 | 10/1998 | (JP) . |
| 10-340787 | 12/1998 | (JP) . |

\* cited by examiner

*Primary Examiner*—Olik Chaudhuri
*Assistant Examiner*—Wai-Sing Louie
(74) *Attorney, Agent, or Firm*—Oblon, Spivak, McClelland, Maier & Neustadt, P.C.

(57) ABSTRACT

The object of the invention is to provide an organic EL device which possesses the merits of both an organic material and an inorganic material, has high efficiency and an extended life, and can be fabricated at low cost. This object is achieved by the provision of an organic EL device comprising a hole injecting electrode, an electron injecting electrode and an organic layer interleaved between these electrodes and including at least a light emitting layer. A high-resistance inorganic electron transporting layer is interleaved between the light emitting layer and the electron injecting electrode and includes a conduction path for blocking holes and transporting electrons. An organic electron injecting layer is interleaved between the high-resistance inorganic electron transporting layer and the electron injecting electrode.

7 Claims, 2 Drawing Sheets

ORGANIC ELECTROLUMINESCENT DEVICE

BACKGROUND OF THE INVENTION

1. Technical Art

The present invention relates generally to an organic EL (electroluminescent) device, and more specifically to an inorganic/organic junction structure used for a device comprising an organic compound thin film which emits light at an applied electric field.

2. Background Art

An organic EL device is now under development and investigation so that it can be used for display purposes, because it can be formed over a large area. In general, an organic EL device is basically built up of an ITO or other transparent electrode formed on a glass substrate, an organic amine base hole transporting layer laminated on the transparent electrode, an organic light emitting layer formed of a material having electronic conductivity and giving out strong light emission, for instance, an $Alq^3$ material, and an electrode provided on the organic light emitting layer and formed of a material having a low work function, for instance, an MgAg material.

As reported so far in the art, the device has a structure wherein one or plural organic compound layers are interleaved between a hole injecting electrode and an electron injecting electrode. The organic compound layer has a double- or triple-layer structure.

Examples of the double-layer structure are a structure wherein a hole transporting layer and a light emitting layer are formed between the hole injecting electrode and the electron injecting electrode, and a structure wherein a light emitting layer and an electron transporting layer are formed between the hole injecting electrode and the electron injecting electrode. In an exemplary triple-layer structure, a hole transporting layer, a light emitting layer and an electron transporting layer are provided between the hole injecting electrode and the electron injecting electrode. A single-layer structure wherein a single layer has all functions, too, is reported in conjunction with a polymer or mixture system.

Typical structures of the organic EL device are shown in FIGS. 3 and 4.

In FIG. 3, a hole transporting layer 14 and a light emitting layer 15, each made of an organic compound, are formed between a hole injecting electrode 12 provided on a substrate 11 and an electron injecting electrode 13. In this case, the light emitting layer 15 also functions as an electron transporting layer.

In FIG. 4, a hole transporting layer 14, a light emitting layer 15 and an electron transporting layer 16, each made of an organic compound, are formed between a hole injecting electrode 12 provided on a substrate 11 and an electron injecting electrode 13.

A problem common to these organic EL devices is reliability. In principle, an organic EL device comprises a hole injecting electrode and an electron injecting electrode and requires an organic layer for efficient injection and transportation of holes and electrons from between these electrodes. However, these materials are sensitive to damages during device fabrication, and offer a problem in conjunction with an affinity for electrodes. Another problem is that the deterioration of an organic thin film is much severer than that of an LED or LD.

An electroluminescent (EL) device emits light under the influence of an electric field. The action of a semiconductor layer forming such an EL manifests itself through radiative combination of electron-hole pairs injected from a pair of electrodes into the semiconductor. One example of this is a light emitting diode based on a GaP semiconductor or other similar group III–V semiconductor. Although these devices are utilized effectively and in wide fields, yet application thereof to large-area displays is not only difficult but also uneconomical because their size is very minute. Some replacements applicable to large-area displays are known in the art. Of such inorganic semiconductors, ZnS is the most useful. However, one non-negligible practical problem with this system is that it is poor in reliability. In one mechanism to which ZnS relates, a kind of carrier is accelerated through the semiconductor in a strong electric field. This is believed to cause local excitation of the semiconductor, which decays upon radiative emission.

To provide a solution to such problems, methods of taking advantage of merits of both an organic material and an inorganic semiconductor material have been envisaged. That is, an organic/inorganic semiconductor junction structure wherein an organic hole transporting layer is substituted by an inorganic p-type semiconductor has been contemplated. Such contemplation has been investigated in Japanese Patent No. 2636341, and JP-A's 2-139893, 2-207488 and 6-119973. However, it is still difficult to obtain an organic EL device superior to prior art organic ELs in terms of emission performance and basic device reliability.

SUMMARY OF THE INVENTION

One object of the invention is to provide an organic EL device which possesses the merits of both an organic material and an inorganic material, has high efficiency and an increased service life, and can be fabricated at low cost.

The above object is achieved by the embodiments defined below.

(1) An organic EL device which comprises:

a hole injecting electrode, an electron injecting electrode and an organic layer interleaved between these electrodes and including at least a light emitting layer, a high-resistance inorganic electron transporting layer interleaved between said light emitting layer and said electron injecting electrode, said high-resistance inorganic electron transporting layer being capable of blocking holes and having a conduction path for carrying electrons, and an organic electron injecting layer interleaved between said high-resistance inorganic electron transporting layer and said electron injecting electrode.

(2) The organic EL device according to (1), wherein said high-resistance inorganic electron transporting layer comprises as a first component at least one oxide having a work function of 4 eV or lower and selected from the group consisting of oxides of an alkali metal element, an alkaline earth metal element, and a lanthanide element, and as a second component at least one metal selected from the group consisting of metals having a work function of 3 to 5 eV.

(3) The organic EL device according to (1), wherein said second component is at least one metal selected from the group consisting of Zn, Sn, V, Ru, Sm, and In.

(4) The organic EL device according to (1), wherein said alkali metal element is at least one element selected from the group consisting of Li, Na, K, Rb, Cs, and Fr, said alkaline earth metal element is at least one element selected from the group consisting of Mg, Ca, and Sr, and said lanthanide element comprises at least one element selected from the group consisting of La, and Ce.

(5) The organic EL device according to (1), wherein said high-resistance inorganic electron transporting layer has a resistivity of 1 to $1 \times 10^{11}$ Ω·cm.

(6) The organic EL device according to (1), wherein said high-resistance inorganic electron transporting layer contains said second component in an amount of 0.2 to 40 mol % relative to all components thereof.

(7) The organic EL device according to (1), wherein said high-resistance inorganic electron transporting layer has a thickness of 0.2 to 30 nm.

EXPLANATION OF THE PREFERRED EMBODIMENTS

Figure 1:
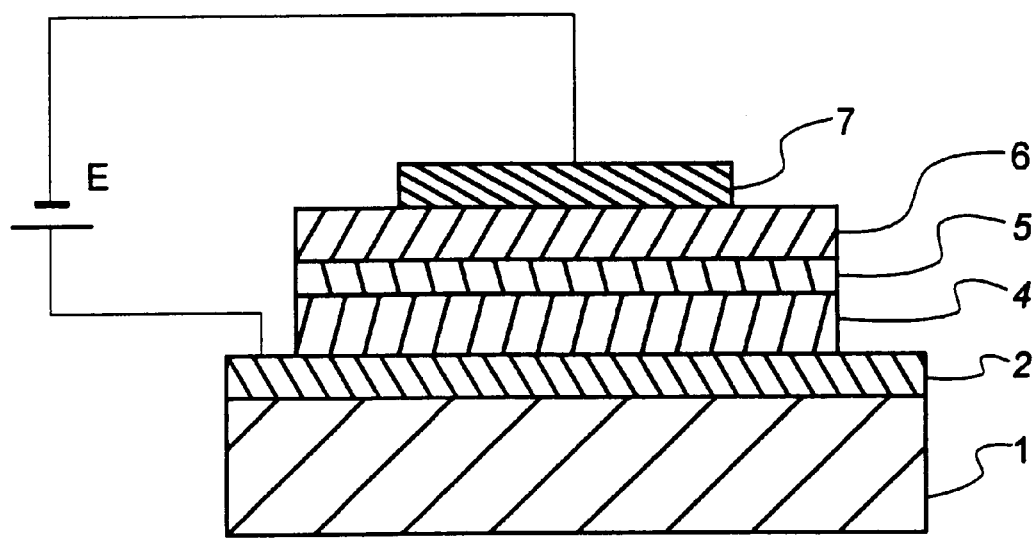
FIG. 1 is a sectional schematic of one basic embodiment of the organic EL device according to the invention.

The organic EL device according to the invention comprises a hole injecting electrode, an electron injecting electrode, an organic layer interleaved between these electrodes and including at least a light emitting layer, a high-resistance inorganic electron transporting layer interleaved between the light emitting layer and the electron injecting electrode, said high-resistance inorganic electron transporting layer being capable of blocking holes and having a conduction path for carrying electrons, an organic electron injecting layer interleaved between the high-resistance inorganic electron transporting layer and the electron injecting electrode.

For the electron injecting electrode material, it is preferable to use a material having a low work function. For instance, use may be made of pure metal elements such as K, Li, Na, Mg, La, Ce, Ca, Sr, Ba, Al, Ag, In, Sn, Zn, and Zr, and a binary or ternary alloy system serving as a stabilizer and containing these elements as well as oxides thereof. Oxides and fluorides of alkali metals such as Li, Na, K, Rb, and Cs may also be used. Exemplary alloys may be Ag.Mg (Ag: 0.1 to 50 at %), Al.Li (Li: 0.01 to 12 at %), In.Mg (Mg: 50 to 80 at %), and Al.Ca (Ca: 0.01 to 20 at %). For the electron injecting electrode layer, a thin film made up of each of these materials, and a multilayer thin film made of two or more such materials may be used.

The electron injecting electrode thin film should preferably have at least a certain thickness enough to inject electrons or a thickness of at least 0.1 nm, preferably at least 0.5 nm, and more preferably at least 1 nm. Although there is no particular upper limit to the electron injecting electrode thickness, the electron injecting electrode may usually have a thickness of the order of 1 to 500 nm. Additionally, an auxiliary electrode (protective electrode) may be located on the electron injecting electrode.

The auxiliary electrode should preferably have at least a certain thickness enough to ensure electron injection efficiency and prevent entrance of moisture, oxygen or organic solvents or a thickness of preferably at least 50 nm, more preferably at least 100 nm, and even more preferably 100 to 500 nm. With too thin an auxiliary electrode, neither is its own effect obtainable, nor is sufficient connection with terminal electrodes obtainable because the ability of the auxiliary electrode to cover steps becomes low. When the auxiliary electrode is too thick, on the other hand, the growth rate of dark spots becomes unacceptably high because of an increase in the stress of the auxiliary electrode.

The auxiliary electrode should preferably be formed of the optimum material chosen depending on the electron injecting electrode material used in combination therewith. For instance, a low-resistance metal such as Al may be used if it is important to make up for low electron injection efficiency of the electron injecting electrode, and a metal compound such as TiN may be used if emphasis is placed on sealability.

Preferably but not exclusively, the total thickness of the electron injecting electrode plus the auxiliary electrode should usually be the order of 50 to 500 nm.

The hole injecting electrode should preferably be composed of a material that can inject holes in the hole injecting layer with high efficiency and has a work function of 4.5 eV to 5.5 eV, for instance, any one of tin-doped indium oxide (ITO), zinc-doped indium oxide (IZO), indium oxide ($In_2O_3$), tin oxide ($SnO_2$), and zinc oxide (ZnO). It is here to be noted that these oxides may deviate slightly from their stoichiometric compositions. Regarding ITO, it is desired that the mixing ratio of $SnO_2$ with respect to $In_2O_3$ be in the range of 1 to 20 wt %, and especially 5 to 12 wt %. Regarding IZO, the mixing ratio of ZnO with respect to $In_2O_3$ is usually in the range of 12 to 32 wt %.

The hole injecting electrode may further contain silicon oxide ($SiO_2$) for work function control. The content of silicon oxide ($SiO_2$) should preferably be of the order of 0.5 to 10% in terms of the molar ratio of $SiO_2$ to ITO. The incorporation of $SiO_2$ contributes to an increase in the work function of ITO.

The electrode on the side out of which light is taken should preferably have a light transmittance of at least 50%, preferably at least 80%, and more preferably at least 90% with respect to light emitted at an emission wavelength of usually 400 to 700 nm. With decreasing transmittance, the light emitted from the light emitting layer attenuates, and so it is difficult to obtain the luminance needed for an light emitting device.

The electrode should preferably have a thickness of 50 to 500 nm, and especially 50 to 300 nm. Although there is no particular upper limit to the electrode thickness, too thick an electrode gives rise to concerns such as a transmittance drop, and defoliation. Too thin an electrode fails to obtain sufficient effect, and offers a problem in conjunction with film thickness, etc. during device fabrication.

The light emitting layer is made up of one organic compound thin film taking part in at least a light emission function or formed by lamination of two or more such organic compound thin films.

The light emitting layer has functions of injecting holes and electrons, transporting them, and recombining holes and electrons to create excitons. For the light emitting layer, it is preferable to use a relatively electronically neutral compound, so that the electrons and holes can be easily injected and transported in a well-balanced state.

Preferably but not exclusively, the thickness of the light emitting layer should be of the order of usually 5 to 500 nm, and especially 10 to 300 nm although varying depending on their formation processes.

In the organic EL device according to the invention, the light emitting layer contains a fluorescent material that is a compound capable of emitting light. The fluorescent material used herein, for instance, may be at least one compound selected from compounds such as those disclosed in JP-A 63-264692, e.g., quinacridone, rubrene, and styryl dyes. Use may also be made of quinoline derivatives such as metal complex dyes containing 8-quinolinol or its derivative as ligands, for instance, tris(8-quinolinolato)aluminum, tetraphenylbutadiene, anthracene, perylene, coronene, and 12-phthaloperinone derivatives. Use may further be made of phenylanthracene derivatives disclosed in JP-A 8-12600 (Japanese Patent Application No. 6-110569) and tetraarylethene derivatives disclosed in JP-A 8-12969 (Japanese Patent Application No. 6-114456).

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by volume, and especially 0.1 to 5% by volume, and the content of the rubrene compound is in the range of preferably 0.01 to 20% by volume. By using the fluorescent compound in combination with the host substance, it is possible to vary the wavelength performance of light emission of the host substance, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 5-70733, 5-258859, 6-215874, etc.

Exemplary aluminum complexes include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolato-lithium, tris(5-chloro-8-quinolinolato)gallium, bis(5-chloro-8-quinolinolato)calcium, 5,7-dichloro-8-quinolinolato-aluminum, tris(5,7-dibromo-8-hydroxyquinolinolato) aluminum, and poly[zinc(II)-bis(8-hydroxy-5-quinolinyl) methane].

Use may also be made of aluminum complexes containing other ligands in addition to 8-quinolinol or its derivatives, for instance, bis(2-methyl-8-quinolinolato)(phenolato) aluminum (III), bis(2-methyl-8-quinolinolato)(o-cresolato) aluminum (III), bis(2-methyl-8-quinolinolato)(m-cresolato) aluminum (III), bis(2-methyl-8-quinolinolato)(p-cresolato) aluminum (III), bis(2-methyl-8-quinolinolato)(o-phenylphenolato)aluminum (III), bis(2-methyl-8-quinolinolato) (m-phenylphenolato)aluminum (III), bis(2-methyl-8-quinolinolato) (p-phenylphenolato)aluminum (III), bis(2-methyl-8-quinolinolato)(2,3-dimethylphenolato)aluminum (III), bis(2-methyl-8-quinolinolato)(2,6-dimethylphenolato) aluminum (III), bis(2-methyl-8-quinolinolato)(3,4-dimethylphenolato)aluminum (III), bis(2-methyl-8-quinolinolato)(3,5-dimethylphenolato) aluminum (III), bis (2-methyl-8-quinolinolato)(3,5-di-tert-butylphenolato) aluminum (III), bis(2-methyl-8-quinolinolato) (2,6-diphenylphenolato)aluminum (III), bis(2-methyl-8-quinolinolato)(2,4,6-triphenylphenolato)aluminum (III), bis (2-methyl-8-quinolinolato)(2,3,6-trimethylphenolato) aluminum (III), bis(2-methyl-8-quinolinolato) (2,3,5,6-tetramethylphenolato)aluminum (III), bis(2-methyl-8-quinolinolato)(1-naphtholato)aluminum (III), bis(2-methyl-8-quinolinolato)(2-naphtholato)aluminum (III), bis(2,4-dimethyl-8-quinolinolato)(o-phenylphenolato)aluminum (III), bis(2,4-dimethyl-8-quinolinolato)(p-phenylphenolato) aluminum (III), bis(2,4-dimethyl-8-quinolinolato)(m-phenylphenolato) aluminum (III), bis(2,4-dimethyl-8-quinolinolato)(3,5-dimethylphenolato)aluminum (III), bis (2,4-dimethyl-8-quinolinolato)(3,5-di-tert-butylphenolato) aluminum (III), bis(2-methyl-4-ethyl-8-quinolinolato)(p-cresolato)aluminum (III), bis(2-methyl-4-methoxy-8-quinolinolato)(p-phenylphenolato)aluminum (III), bis(2-methyl-5-cyano-8-quinolinolato)(o-cresolato)aluminum (III), and bis(2-methyl-6-trifluoromethyl-8-quinolinolato) (2-naphtholato)aluminum (III).

Besides, use may be made of bis(2-methyl-8-quinolinolato)aluminum (III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum (III)-$\mu$-oxo-bis(4-ethyl-2-methyl-8-quinolinolato)aluminum (III), bis(2-methyl-4-methoxyquinolinolato)aluminum (III)-$\mu$-oxo-bis(2-methyl-4-methoxyquinolinolato)aluminum (III), bis(5-cyano-2-methyl-8-quinolinolato)aluminum (III)-$\mu$-oxo-bis(5-cyano-2-methyl-8-quinolinolato)aluminum (III), bis(2-methyl-5-trifluoromethyl-8-quinolinolato)aluminum (III)-$\mu$-oxo-bis (2-methyl-5-trifluoromethyl-8-quinolinolato)aluminum (III), etc.

Other preferable host substances include phenylanthracene derivatives disclosed in JP-A 8-12600 (Japanese Patent Application No. 6-110569), tetraarylethene derivatives disclosed in JP-A 8-12969 (Japanese Patent Application No. 6-114456), etc.

In the practice of the invention, the light emitting layer may also serve as an electron injecting and transporting layer. In this case, it is preferable to use a fluorescent material, e.g., tris(8-quinolinolato)aluminum or the like, which may be provided by deposition by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by volume, and especially 0.1 to 15% by volume.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later.

For the compounds capable of injecting and transporting electrons, it is preferable to use metal complexes containing quinoline derivatives, especially 8-quinolinol or its derivatives as ligands, in particular, tris(8-quinolinolato) aluminum (Alq3). It is also preferable to use the aforesaid phenylanthracene derivatives, and tetraarylethene derivatives.

For the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

In this case, the ratio of mixing the compound capable of injecting and transporting holes with respect to the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, especially 10/90 to 90/10, and more especially 20/80 to 80/20.

The mixed layer should have preferably a thickness that is equal to or larger than the thickness of a single molecular layer and less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an island form may be present in the mixed layer. The light emitting layer may generally be formed at a given thickness by the evaporation of the organic fluorescent substance or coating a dispersion of the organic fluorescent substance in a resin binder.

No special limitation is imposed on conditions for vacuum evaporation. However, the vacuum evaporation should preferably be carried out at a degree of vacuum of up to $10^{-4}$ Pa and a deposition rate of about 0.01 to 1 nm/sec. Also, the layers should preferably be continuously formed in vacuo, partly because the deposition of impurities on the interface between adjacent layers is avoidable resulting in the achievement of high performance, and partly because the driving voltage of the device can be lowered with elimination of dark spots or no growth of dark spots.

When the layers, each containing a plurality of compounds, are formed by the vacuum evaporation process, it is preferable that co-evaporation is carried out while each boat with the compounds charged therein is placed under temperature control.

In the organic EL device of the invention, the high-resistance inorganic electron transporting layer is provided between the light emitting layer and the electron injecting electrode (cathode).

By providing between the light emitting layer and the organic electron injecting electrode the high-resistance inorganic electron transporting layer including an electron conduction path and capable of blocking holes, it is thus possible to inject electrons into the light emitting layer with high efficiency and, hence, achieve improved light emission efficiency with a driving voltage drop.

The conduction path should preferably be formed by using the second component of the high-resistance inorganic electron transporting layer in an amount of 0.2 to 40 mol % relative to all components thereof, so that electrons can be injected, with high efficiency, from the electron injecting electrode into the organic layer on the light emitting layer side. In addition, migration of holes from the organic layer to the electron injecting electrode side can be inhibited, thereby ensuring efficient recombination of holes and electrons in the light emitting layer. Furthermore, it is possible to achieve an organic EL device having the merits of both the inorganic material and the organic material. The organic EL device of the invention has luminance equivalent to or higher than that of a device comprising a prior art organic electron injecting and transporting layer, and is higher in heat resistance and weather resistance than such a device. Thus, the EL device of the invention is longer in service life than the prior art device and less susceptible to leakage and dark spots than the prior art device. Moreover, the organic EL device of the invention can be fabricated at lower cost because not only a relatively expensive organic material but also an inexpensive, easily available, and easy-to-produce inorganic material can be used.

The inorganic electron transporting layer of high resistance should preferably have a resistivity of 1 to $1 \times 10^{11} \Omega \cdot cm$, and especially $1 \times 10^3$ to $1 \times 10^8 \Omega \cdot cm$. By limiting the resistivity of the inorganic electron injecting and transporting layer of high resistance to the above range, it is thus possible to achieve remarkable improvements in electron injection efficiency while high electron block capabilities are kept. The resistivity of the inorganic electron transporting layer of high resistance may also be found from sheet resistance and thickness.

The high-resistance inorganic electron transporting layer should preferably comprise as the first component an oxide which has a work function of 4 eV or lower, and preferably 1 to 4 eV, and is selected from the group consisting of:

an oxide or oxides of at least one alkali metal element selected from the group consisting of Li, Na, K, Rb, Cs, and Fr, an oxide or oxides of at least one alkaline earth metal element selected from the group consisting of Mg, Ca, and Sr, and an oxide or oxides of at least one lanthanide element selected from the group consisting of La, and Ce. Of these oxides, lithium oxide, magnesium oxide, calcium oxide and cerium oxide are most preferred. In use, they may be mixed at any desired ratio. The mixture should then preferably contain lithium oxide in an amount of at least 50 mol % as calculated in the form of $Li_2O$.

The high-resistance inorganic electron transporting layer should preferably contain as the second component at least one element selected from the group consisting of Zn, Sn, V, Ru, Sm, and In. The content of the second component should then be preferably 0.2 to 40 mol %, and more preferably 1 to 20 mol %. At a lower content the function of injecting electron becomes worse and at a higher content the function of blocking holes becomes worse. When two or more elements are used in combination, it is preferred that the total content of the elements be within the above range. The second component may be present in the form of either a metal element or an oxide.

The incorporation of the electrically conductive (low-resistance) second component in the first component of high resistance allows the conductive material to take an island form in the insulating material. This is then believed to create a hopping path for electron injection.

Although the first component oxide has usually a stoichiometric composition, yet it may deviate slightly from the stoichiometric composition or it may have a non-stoichiometric composition. The same also holds for the second component oxide although it is usually present in the form of an oxide.

The high-resistance inorganic electron transporting layer may further contain as impurities H, and Ne, Ar, Kr, Xe, etc. used for sputtering gases in a total amount of 5 at % or less.

It is to be noted that if the high-resistance inorganic electron transporting layer has such an average composition as a whole, it is then acceptable that the layer is not uniform or has a concentration gradient in the thickness direction.

The high-resistance inorganic electron transporting layer is usually in an amorphous state.

The inorganic electron transporting layer of high resistance should preferably have a thickness of about 0.2 to 30 nm, and especially about 0.2 to 10 nm. Too large or small a thickness does not allow the electron transporting layer to have its own function.

The high-resistance inorganic electron transporting layer may possibly be fabricated by various physical or chemical thin-film formation techniques such as a sputtering technique, and an evaporation technique, with the sputtering technique being preferred. Particular preference is given to a multi-sputtering technique wherein targets for the first and second components are separately sputtered. In the multi-sputtering technique, suitable sputtering processes can be applied to the respective targets. In a single sputtering technique, it is preferable to use a mixed target wherein the first and second components are mixed together.

When the high-resistance inorganic electron transporting layer is formed by means of the sputtering technique, the gas pressure for sputtering should preferably be in the range of 0.1 to 1 Pa. For the sputtering gas, inert gases used with ordinary sputtering systems, for instance, Ar, Ne, Xe, and Kr may be used, if required, together with $N_2$. For a reactive sputtering process, these sputtering gases may be mixed with about 1 to 99% of $O_2$ to provide a sputtering atmosphere.

For the sputtering technique, an RF sputtering process using an RF power source, a DC sputtering process, etc. may be used. A sputtering system should preferably be operated at 0.1 to 10 W/cm$^2$ for RF sputtering, with a film deposition rate of 0.5 to 10 nm/min. and especially 1 to 5 nm/min.

A substrate should be set in the range of room temperature (25° C.) to about 150° C. during film deposition.

In addition to the aforesaid light emitting layer, the organic EL device of the invention may comprise an inorganic electron transporting layer plus an organic electron injecting layer and, if required, a hole injecting and transporting layer.

For the electron injecting layer and hole injecting and transporting layer, each comprising an organic material, it is preferable to use the materials capable of injecting and transporting electrons, and holes, such as those already mentioned.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyl-diamine (TPD)), aromatic tertiary amines, hydrazone derivatives, carbazole derivatives, triazole derivatives, imidazole derivatives, oxadiazole derivatives having an amino group, and polythiophenes. These compounds may be used singly or in combination of two or more. Where two or more such compounds are used, they may be stacked as separate layers, or otherwise mixed.

For the electron injecting layer, there may be used quinoline derivatives such as organic metal complexes containing 8-quinolinol or its derivatives as ligands, for instance, tris (8-quinolinolato)aluminum (Alq3), oxadiazole derivatives, perylene derivatives, pyridine derivatives, pyrimidine derivatives, quinoxaline derivative, diphenylquinone derivatives, and nitro-substituted fluorene derivatives. The electron injeting and transporting layer may also serve as a light emitting layer. In this case, it is preferable to use tris(8-quinolilato)aluminum, etc. The electron injecting layer should preferably be formed by deposition by evaporation, etc., as is the case with the light emitting layer.

When the hole injecting and transporting layer is provided as a separate hole injecting layer and a separate hole transporting layer, two or more compounds are selected in a preferable combination from the compounds already mentioned for the hole injecting and transporting layer. In this regard, it is preferable to laminate layers in such an order that a compound layer having the lowest electron affinity is disposed contiguous to the hole injecting electrode. This order of lamination holds for the provision of two or more hole injecting and transporting layers.

Preferably but not exclusively, the thickness of the organic hole injecting and transporting layer and the thickness of the electron injecting layer should usually be of the order of 5 to 500 nm, and especially 10 to 300 nm, although varying with formation techniques. When a hole injecting layer and a hole transporting layer are separately provided, it is preferable that the injecting and transporting layers have each a thickness of at least 1 nm. The upper limit to thickness is usually about 500 nm for the injecting layer, and about 500 nm for the transporting layer.

Preferably, the light emitting layer, the organic hole injecting and transporting layer, and the electron transporting layer are formed by a vacuum evaporation process because a uniform thin film can then be obtained. With the vacuum evaporation process, it is thus possible to obtain a uniform thin film in an amorphous state or with a grain size of up to 0.2 $\mu$m. A grain size of greater than 0.2 $\mu$m results in non-uniform light emission. To avoid this, it is required to make the driving voltage of the device high. However, this in turn gives rise to some considerable drop of hole or electron injection efficiency.

No special limitation is imposed on conditions for vacuum evaporation. However, the vacuum evaporation should preferably be carried out at a degree of vacuum of up to 10$^{-4}$ Pa and a deposition rate of about 0.01 to 1 nm/sec. Also, the layers should preferably be continuously formed in vacuo, partly because the deposition of impurities on the interface between adjacent layers is avoidable resulting in the achievement of high performance, and partly because the driving voltage of the device can be lowered with elimination of dark spots or no growth of dark spots.

When the layers, each containing a plurality of compounds, are formed by the vacuum evaporation process, it is preferable that co-evaporation is carried out while each boat with the compounds charged therein is placed under temperature control.

Preferably, the device is sealed up by means of a sealing sheet, etc. for the purpose of preventing degradation of the organic layers and electrodes in the device. To prevent penetration of moisture, the sealing sheet is bonded to the device using an adhesive resin layer to seal up the device. An inert gas such as Ar, He, and $N_2$ is preferably used as a sealing gas. Then, the sealing gas should preferably have a moisture content of up to 100 ppm, especially up to 10 ppm, and more especially up to 1 ppm. Although there is no particular lower limit to the moisture content, the sealing gas should usually have a moisture content of about 0.1 ppm.

The sealing sheet, preferably in a flat sheet form, may be made of transparent or translucent materials such as glasses, quartz, and resins, among which the glasses are preferred. For such glass materials, alkali glass is preferable from a cost standpoint. Other preferable glass materials, for instance, include soda lime glass, lead alkali glass, borosilicate glass, aluminosilicate glass, and silica glass. In particular, a soda glass material subjected to no surface treatment is inexpensive and so is preferable. A metal sheet, a plastic sheet or the like, too, may be used in place of the sealing glass sheet.

For height control, a spacer is used to keep the sealing sheet at a height as desired. The spacer material may be resin beads, silica beads, glass beads, glass fibers, etc., with the glass beads being most preferred. The spacer is usually in a particulate form having a uniform particle size. In the invention, however, a spacer of any desired shape may be used provided that it can function well. The spacer size should preferably be 1 to 20 $\mu$m, especially 1 to 10 $\mu$m, and more especially 2 to 8 $\mu$m as calculated on a circle diameter basis. A spacer having such a diameter should preferably have a particle length of up to about 100 $\mu$m. Although there is no particular lower limit to the particle size, the particle size should usually be equal to or larger than the diameter.

The spacer may or may not be used when a recess is provided in the sealing sheet. When the spacer is used, its size is preferably within the aforesaid range, and more preferably within the range of 2 to 8 $\mu$m.

The spacer may have been incorporated in the sealing adhesive agent or may be incorporated in the sealing adhesive agent at the time of bonding. The content of the spacer in the sealing adhesive agent should be preferably 0.01 to 30 wt %, and more preferably 0.1 to 5 wt %.

For the adhesive agent, it is preferable to use a cation curing epoxy resin of the ultraviolet curing type, although an adhesive agent of the type that ensures stable adhesion strength and good airtightness may be used.

For the substrate on which an organic EL structure is formed according to the invention, a noncrystalline substrate such as a glass or quartz substrate, and a crystalline substrate such as an Si, GaAs, ZnSe, ZnS, GaP or InP substrate may be used. The crystalline substrate may also be provided with a crystalline or noncrystalline buffer layer or a metal buffer layer. For a metal substrate, Mo, Al, Pt, Ir, Au, Pd, and other metal substrates may be used. However, it is preferable to use a glass substrate. The substrate is usually located on the side out of which light is taken, and so it should preferably be transparent to light as in the above electrodes.

In the invention, a number of devices may be arranged on a plane. A color display may be constructed by changing the colors of light emitted from the devices arranged on the plane.

The substrate may be provided with a color filter film, fluorescent material-containing color conversion film or dielectric reflecting film for controlling the color of light emission.

For the color filter film, a color filter employed with liquid crystal display devices, etc. may be used. However, it is preferable to control the properties of the color filter in conformity to the light emitted from the organic EL device, thereby optimizing the efficiency of taking out light emission and color purity.

By using a color filter capable of cutting off extraneous light of such short wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. When the color conversion filter film is provided on the substrate while it is in contact with the hole injecting electrode, it is also preferable to use a binder material that is not damaged during (ITO or IZO) film formation.

The light absorbing material is used when light is not fully absorbed by the fluorescent material, and so may be dispensed with, if not required. For the light absorbing material, it is preferable to make a selection from materials that do not extinguish fluorescence.

The organic EL device of the invention is generally of the DC drive type while it may be of the AC or pulse drive type. The applied voltage is generally of the order of 2 to 30 volts.

Figure 2:
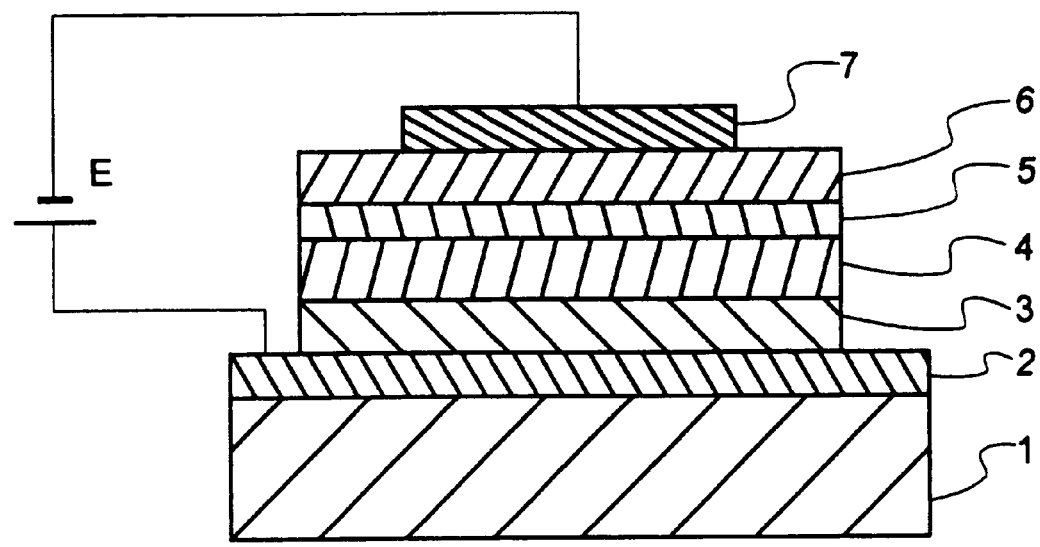
FIG. 2 is a sectional schematic of another basic embodiment of the organic EL device according to the invention.
Figure 3:
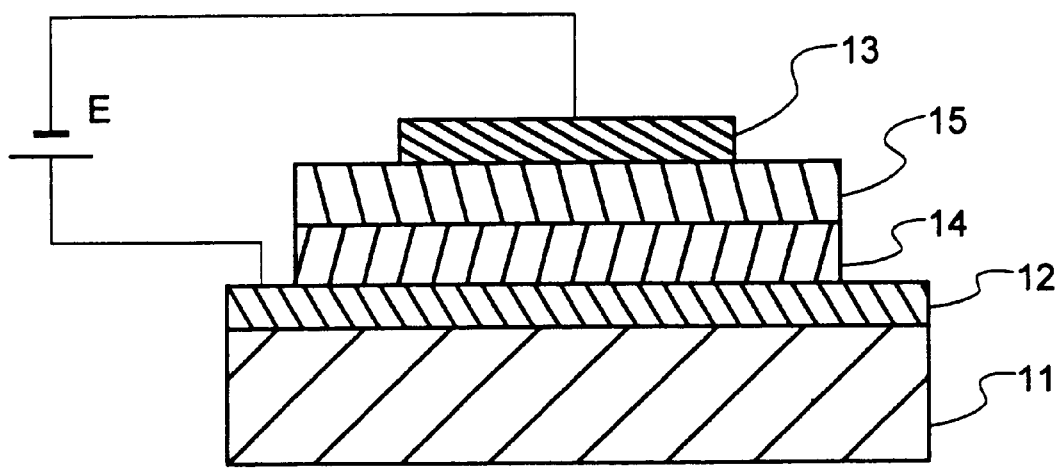
FIG. 3 is a sectional schematic of one architecture example of a prior art organic EL device.
Figure 4:
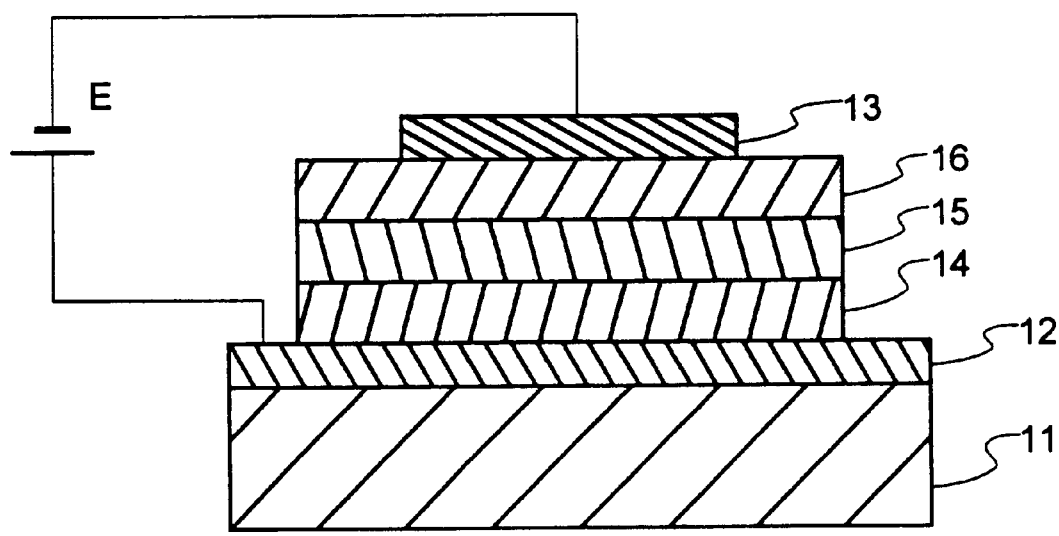
FIG. 4 is a sectional schematic of another architecture example of the prior art organic EL device.

The organic EL device of the invention may have such construction as shown in FIG. 1, wherein, in order from a substrate 1, a hole injecting layer 2, a light emitting layer 4, a high-resistance inorganic electron transporting layer 5, an organic electron injecting layer 6 and an electron injecting electrode 7 are laminated or otherwise stacked on the substrate 1. Alternatively, the organic EL device may have such construction as shown in FIG. 2, wherein, in order from a substrate 1, a hole injecting electrode 2, a hole injecting and transporting layer 3, a light emitting layer 4, a high-resistance electron transporting layer 5, an organic electron injecting layer 6 and an electron injecting layer 7 are laminated or otherwise stacked on the substrate 1. This order of lamination may be reversed to set up a so-called reverse lamination structure. These may be appropriately selected, for instance, depending on display specifications, fabrication processes, etc. In FIGS. 1 and 2, a driving power source E is connected between the hole injecting electrode 2 and the electron injecting electrode 7.

According to the invention, devices may be placed one upon another in a cascade manner, so that the emitted light can be controlled in terms of color tone or displayed in multiple colors.

The organic EL device or devices of the invention may be applied not only to display systems but also to various optical systems such as pickups used for reading/writing memories, photocouplers, and relay devices in optical communication transmission lines.

EXAMPLE

Example 1

A 7059 substrate (made by Corning) used as a glass substrate was scrubbed with neutral detergent.

At a substrate temperature of 250° C., an ITO hole injecting electrode layer of 200 nm in thickness was formed on the substrate by means of an RF magnetron sputtering process using an ITO oxide target.

Then, the substrate with the ITO electrode layer, etc. formed thereon was washed on its surface with $UV/O_3$, and then fixed to a substrate holder in a vacuum evaporation system, which was evacuated to a vacuum of $1\times10^{-4}$ Pa or lower.

N,N,N',N'-tetrakis(m-biphenyl)-1,1'-biphenyl-4,4'-diamine (TPD), tris(8-quinolinolato)aluminum (Alq3) and rubrene were deposited by evaporation at an overall deposition rate of 0.2 nm/sec. to a thickness of 40 nm thereby forming a light emitting layer. The mixture of TPD and $Alq^3$ at 1:1 by weight was doped with 5 vol % of rubrene.

Then, the substrate was transferred into a sputtering system, where a high-resistance inorganic electron injecting and transporting layer of 2 nm in thickness was formed on the substrate using a target obtained by mixing $Li_2O$ with 4 mol % of V. This sputtering was carried out at room temperature (25° C.), a film deposition rate of 1 nm/min., an operating pressure of 0.2 to 2 Pa and a power input of 500 W, using a sputtering gas containing 30 sccm of Ar and 5 sccm of $O_2$. The thus obtained inorganic electron injecting layer was found to have a composition substantially similar to that of the target.

With the vacuum still maintained, tris(8-quinolinolato)aluminum (Alq3) was then deposited by evaporation at an overall deposition rate of 0.2 nm/sec. to a thickness of 30 nm, thereby forming an electron injecting layer.

With the vacuum still kept, AlLi (Li: 7 at %) was then deposited by evaporation to a thickness of 1 nm, and Al was subsequently deposited by evaporation to a thickness of 200 nm, thereby forming an electron injecting electrode and an auxiliary electrode, respectively. Finally, the thus obtained EL structure was sealed up by glass to obtain an organic EL device.

When an electric field was applied to the obtained organic EL device in the air, it showed diode performance. When the device was biased with ITO on a positive side and AlLi/Al electrode on a negative side, the current increased with increasing voltage, and distinct light emission was observed from the sealing sheet side in an ordinary room. Even upon repetitive emission operations, no luminance decrease was found.

Upon measured by a four-terminal method, the high-resistance inorganic hole transporting layer was found to have a sheet resistance of 7 $k\Omega/cm^2$ at a sheet thickness of 100 nm, which corresponded to a resistivity of $7\times10^8 \Omega \cdot cm$.

Example 2

An organic EL device was prepared and estimated as in Example 1. However, a hole injection electrode was first formed. Then, MTDATA was deposited by evaporation at a deposition rate of 0.1 nm/sec. to a thickness of 10 nm thereby forming a hole injecting layer and TPD was deposited by evaporation at a deposition rate of 0.1 nm/sec. to a thickness of 20 nm thereby forming a hole transporting layer. As a result, it was found that when driven with a constant current, there is an improvement in light emission luminance with an increased luminance half-life.

More specifically, the obtained organic EL device was found to have an initial luminance of 950 $cd/m^2$ and a driving voltage of 6.9 V when driven at a constant current density of 10 $mA/cm^2$ in the air.

Example 3

Examples 1 and 2 were repeated with the exception that the composition of the high-resistance inorganic electron injecting layer was changed from $Li_2O$ to an oxide or oxides selected from oxides of an alkali metal element such as Na, K, Rb, Cs and Fr, an alkaline earth metal element such as Be, Mg, Ca, Sr, Ba and Ra, and a lanthanide element such as La, Ce, Pr, Nd, Pm, Sm, Eu, Gd, Tb, Dy, Ho, Er, Tm, Yb and Lu. In these cases, too, similar results were obtained.

When V was changed to at least one element selected from Ru, Zn, Sm and In, too, similar results were obtained.

Example 4

In Example 2, a high-resistance inorganic hole injecting layer of 20 nm in thickness was formed while an Au pellet of predetermined size was placed on a $GeO_2$ target. This sputtering was carried out at room temperature (25° C.), a deposition rate of 1 nm/min., an operating pressure of 0.2 to 2 Pa and a power input of 500 W, using a sputtering gas containing 30 sccm of Ar and 5 sccm of $O_2$. The thus obtained inorganic hole injecting layer was composed of $GeO_2$ with 2 mol % of Au contained therein.

An organic EL device was prepared as in Example 1 under otherwise similar conditions, and estimated as in Example 1. The results were substantially similar to those of Example 1.

Comparative Example

An organic EL device was prepared and estimated as in Example 1. However, an ITO hole injection electrode was first formed. Then, MTDATA was deposited by evaporation at a deposition rate of 0.1 nm/sec. to a thickness of 10 nm thereby forming a hole injecting layer and TPD was deposited by evaporation at a deposition rate of 0.1 nm/sec. to a thickness of 20 nm thereby forming a hole transporting layer. Following formation of a light emitting layer, tris(8-quinolinolato)aluminum (Alq3) was deposited by evaporation at a deposition rate of 0.2 nm/sec. to a thickness of 40 nm thereby forming an organic injecting and transporting layer. As a result, the initial luminance was found to be 750 $cd/m^2$ upon driven at a constant current density of 10 $mA/m^2$.

Effectiveness of the Invention

According to the invention as explained above, it is possible to provide an organic EL device which possesses the merits of both an organic material and an inorganic material, has high efficiency and an extended life, and can be fabricated at low cost.

What we claim is:

1. An organic EL device which comprises:
   a hole injecting electrode, an electron injecting electrode and an organic layer interleaved between these electrodes and including at least a light emitting layer,
   a high-resistance inorganic electron transporting layer interleaved between said light emitting layer and said electron injecting electrode,
   said high-resistance inorganic electron transporting layer being capable of blocking holes and having a conductive path for carrying electrons, and
   an organic electron injecting layer interleaved between said high-resistance inorganic electron transporting layer and said electron injecting electrode, wherein said high-resistance inorganic electron transporting layer comprises as a first component at least one oxide having a work function of 4 eV or lower and selected from the group consisting of oxides of an alkali metal element, an alkaline earth metal element, and a lanthanide element, and as a second component at least one metal or oxide thereof selected from the group consisting of metals and oxides thereof having a work function of 3 to 5 eV.

2. The organic EL device according to claim 1, wherein said high-resistance inorganic electron transporting layer comprises as a first component at least one oxide having a work function of 4 eV or lower and selected from the group consisting of oxides of an alkali metal element, an alkaline earth metal element, and a lanthanide element, and as a second component at least one metal selected from the group consisting of metals having a work function of 3 to 5 eV.

3. The organic EL device according to claim 1, wherein said second component is at least one metal selected from the group consisting of Zn, Sn, V, Ru, Sm, and In.

4. The organic EL device according to claim 1, wherein said alkali metal element is at least one element selected from the group consisting of Li, Na, K, Rb, Cs, and Fr, said alkaline earth metal element is at least one element selected from the group consisting of Mg, Ca, and Sr, and said lanthanide element comprises at least one element selected from the group consisting of La, and Ce.

5. The organic EL device according to claim 1, wherein said high-resistance inorganic electron transporting layer has a resistivity of 1 to $1 \times 10^{11}$ $\Omega \cdot$cm.

6. The organic EL device according to claim 1, wherein said high-resistance inorganic electron transporting layer contains said second component in an amount of 0.2 to 40 mol % relative to all components thereof.

7. The organic EL device according to claim 1, wherein said high-resistance inorganic electron transporting layer has a thickness of 0.2 to 30 nm.

* * * * *